(12) United States Patent
Im

(10) Patent No.: US 7,977,188 B2
(45) Date of Patent: Jul. 12, 2011

(54) METHOD FOR FABRICATING SEMICONDUCTOR MEMORY DEVICE

(75) Inventor: Song hyeuk Im, Cheongju-si (KR)

(73) Assignee: Hynix Semiconductor Inc., Icheon (KR)

( * ) Notice: Subject to any disclaimer, the term of this patent is extended or adjusted under 35 U.S.C. 154(b) by 95 days.

(21) Appl. No.: 12/493,069

(22) Filed: Jun. 26, 2009

(65) Prior Publication Data

US 2010/0155832 A1    Jun. 24, 2010

(30) Foreign Application Priority Data

Dec. 23, 2008  (KR) .................. 10-2008-0132417

(51) Int. Cl.
*H01L 21/336*    (2006.01)

(52) U.S. Cl. ... 438/259; 438/270; 257/330; 257/E21.546
(58) Field of Classification Search .................. 438/259, 438/270, 424; 257/330, E21.546, E29.262
See application file for complete search history.

(56) References Cited

U.S. PATENT DOCUMENTS

| 7,534,726 B2 * | 5/2009 | Park et al. ..................... 438/700 |
| 2005/0106820 A1 * | 5/2005 | Tran ............................. 438/270 |

* cited by examiner

*Primary Examiner* — Phat X Cao
*Assistant Examiner* — Nga Doan

(57) ABSTRACT

A method for manufacturing a semiconductor device comprises forming a first spacer layer at sidewalls of one or more gate electrodes, forming a trench by etching an isolation insulating layer exposed between the gate electrodes, forming a second spacer layer on sidewalls of the gate electrodes and an inner surface of the trench and forming an interlayer insulating layer between the gate electrodes.

11 Claims, 8 Drawing Sheets

METHOD FOR FABRICATING SEMICONDUCTOR MEMORY DEVICE

CROSS-REFERENCE TO RELATED APPLICATION

The priority based on Korean patent application No. 10-2008-0132417 filed on Dec. 23, 2008, the disclosure of which is hereby incorporated in its entirety by reference, is claimed.

BACKGROUND OF THE INVENTION

The present invention relates to a method for fabricating a highly-integrated semiconductor device, and more specifically, to a method for forming a unit cell capable of making a semiconductor device operate faster and more stable.

A semiconductor memory chip includes a plurality of unit cells each of which includes a capacitor and a transistor. A double capacitor has been used to temporarily store data. A transistor transmits data between a bit line and a capacitor according to a control signal (word line). The transistor has three regions including a gate, a source and a drain, and electrical charges move between the source and the drain in response to a control signal which is applied to the gate. The electrical charges move through a channel region formed between the source and the drain.

A gate is formed on a semiconductor substrate, and impurities are doped on the substrate at both sides of the gate to form a source and a drain. To meet requirements for enhanced data capacity and integration in a semiconductor memory apparatus, unit cell size needs to be smaller. It makes the design rule applied for the capacitor and the transistor decreased. As a result, channel length becomes shorter, causing a short channel effect and a drain induced barrier lower (DIBL) effect that hinders normal operation. For preventing the short channel effect and the DIBL effect, the doping concentration of the channel region has been increased to meet a threshold voltage required in the cell transistor. However, as the design rule becomes less than 100 nm, the highly doped channel region causes electric field of a storage node (SN) junction increased, therefore deteriorating a refresh characteristic of the semiconductor memory apparatus. In order to prevent the degradation of refresh characteristic, a cell transistor with a three-dimensional structure is suggested. Such structure may secure long channel length for the cell transistor under low design rule. Moreover, if long channel length is secured, the doping concentration on the channel region can be adjusted to such a low level that would not degrade refresh characteristic. Hereinafter, a process for forming a recess-gate transistor with a three-dimensional structure is described.

FIGS. 1 to 7 are cross-sectional views illustrating a method for fabricating a general semiconductor device.

Referring to FIG. 1, a recess 104 for forming either a recess gate or a fin gate is formed on a semiconductor substrate 100 where an isolation insulating layer 102 defining an active region is formed. In this case, since either the recess gate or the fin gate is arranged in a cell array in the direction extending across the active region, the recess 104 for forming either the recess gate or the fin gate is formed in both the active region and the isolation insulating layer 102.

Thereafter, as shown in FIG. 2, a gate material is provided in the recess 104 so that a gate electrode 106 is formed.

Referring to FIG. 3, a first spacer layer 108, e.g., a nitride spacer, is deposited on the substrate and on the gate electrode 106. The first spacer nitride layer 108 is deposited to a predetermined thickness on the gate electrode 106. An oxide layer 110 is deposited on the first spacer nitride layer 108 so that a core region and a peripheral region of the semiconductor substrate 100 are covered with the oxide layer 110.

Referring to FIG. 4, after a photoresist layer (not shown) is deposited on the oxide layer 110, the photoresist layer formed on the core region is etched using a cell open mask in order to expose the core region including the cell array, so that the oxide layer 110 in the core region is exposed. Thereafter, the oxide layer 110 covering the core region is removed by a wet etching process so that a first spacer layer 108 is exposed.

Referring to FIG. 5, a second spacer layer 112, e.g., a nitride spacer, is deposited on the exposed first spacer layer 108 in the core region. The second spacer layer 112 is formed to electrically isolate the gate electrode 106 from other conductive elements like a bit line contact or a storage node contact, which will be formed between gate electrodes 106 during post processes. In order to completely isolate the contact from the gate electrodes 106, the second spacer layer 112 is generally formed with a thickness of 50~150 Å.

Referring to FIG. 6, an insulation material having superior gap-fill properties is deposited on the second spacer layer 112, and a chemical mechanical polishing (CMP) process is performed until the second spacer layer 112 is exposed. As a result, an interlayer insulating layer 114 is formed at a fine space between the gate electrodes 106.

Referring to FIG. 7, the interlayer insulating layer 114 formed in a region where a bit line contact or storage node contact in the core region will be formed is removed by an etch-back process so that a contact hole 116 is formed. The contact hole 116 is for forming a contact for connecting an active region to either a capacitor or a bit line which will be formed in a subsequent step. After the etch-back process is performed, partial portions of first and second spacer layers 108 and 112 formed at sidewalls of the gate electrode 106 still remain unetched, but the first and second spacer layers 108 and 112 formed on the active region and the isolation insulating layer 102 are completely removed. If the first and second spacer layers 108 and 112 remain on the active region, it would hinder the contact formed in the contact hole 116 from being connected to a source/drain region of a transistor. Thus, the etch-back process should be performed to a sufficient depth so as to prevent the above-mentioned problem. However, when an over etch is performed, the substrate in the active region and the isolation insulating layer 102 are attacked and damaged.

As the size of the semiconductor device shrinks gradually, an insulation material with poor gap-fill properties is not compatible with a high density plasma (HDP) deposition process to form the isolation insulating layer 102 because it results in voids within the isolation insulating layer 102. Accordingly, the isolation insulating layer 102 filling a trench (not shown) is generally composed of two insulating layers, i.e., one is with superior gap-fill properties so as to be compatible with a Spin-On-Dielectric (SOD) deposition process and the other compatible with a HDP deposition process. However, since most of insulation material subject to the HDP deposition process do not have superior gap-fill properties, it is hard to prevent the aforementioned problem.

Accordingly, a method of using insulation material that is compatible with a SOD deposition process without using insulation material compatible with a HDP deposition process for forming the isolation insulating layer 102 has been developed. However, pattern collapse or distortion is occurred because an exposed region is easily attacked due to an extremely high etch rate of the insulation material. Further, it forms a layer with irregular surface, thus causing a defect in a product. In order to overcome the above-mentioned problems, a method was recently developed for forming the isolation insulating layer 102 using both an insulation material compatible with the SOD deposition process and a Sub-Atmospheric Tetra-Ethyl Ortho Silicate (SATEOS) layer. However, some process steps for that method are so complicated and the number of process steps increases, resulting in longer Turn Around Time (TAT).

In addition, if the isolation insulating layer 102 is formed of both the insulation layer compatible with the SOD deposition process and the SATEOS layer, partial portions of the isolating layer 102 can be undesirably etched and removed by not only a first cleaning process performed after the recesses 104 are formed but also a second cleaning process performed after the interlayer insulating layer 114 and the first and second spacer layers 108 and 112 are removed. Since the recess 104 formed on the isolation insulating layer 102 can be formed wider than another recess 104 formed on the active region because of the first cleaning process, the distance between gate electrodes 106 which is formed on the isolation insulating layer 102 is reduced, resulting in a reduction of process margin. Also, due to the second cleaning process, the isolation insulating layer 102 exposed between gate electrodes 106 formed on the isolation insulating layer 102 is excessively etched so that the contact can be in electrical short with the gate electrode 106. Particularly, this electrical short causes a serious problem threatening operational stability of the semiconductor device.

FIG. 8 is a scanning electron microscope (SEM) image illustrating shortcomings of the semiconductor device manufactured by the aforementioned processes shown in FIGS. 1 to 7.

As shown, both a recess gate formed on the isolation insulating layer and a contact formed between the recess gates are electrically interconnected, so that the operational stability of the semiconductor device is deteriorated. Particularly, when a high voltage (Vpp) higher than a power-supply voltage (VDD) is supplied to each recess gate used as the word line in a semiconductor memory device while a logic low signal of a ground voltage (Vss) corresponding to data "0" are sustained in the contact, data can be unexpectedly distorted by an electrical connection between the contact and the recess gate.

BRIEF SUMMARY OF THE INVENTION

Various embodiments of the present invention are directed to providing a semiconductor memory device and a method for fabricating the same. In the semiconductor memory device of the present invention, when a spacer is formed at sidewalls of the recess gates in an active region of a high-integration semiconductor device, an etching prevention layer is formed even on an inactive region so as to prevent the inactive region from being excessively etched by a cleaning process, so that electrical collision or poor connection between the contact and the recess gate is reduced, resulting in a guarantee of a process margin.

In an embodiment of the present invention, a method for manufacturing a semiconductor device comprises forming a first spacer layer at sidewalls of one or more gate electrodes, forming a trench by etching an isolation insulating layer exposed between the gate electrodes, forming a second spacer layer on sidewalls of the gate electrodes and an inner surface of the trench and forming an interlayer insulating layer between the gate electrodes.

The present invention provides a method for manufacturing a semiconductor memory device, comprising forming a first spacer layer at sidewalls of one or more gate electrodes, forming a trench by etching an isolation insulating layer exposed between the gate electrodes, forming a second spacer layer not only on sidewalls of the gate electrodes but also on sidewalls and the bottom of the trench, burying an interlayer insulating layer between the gate electrodes, forming a contact hole between the gate electrodes, and forming a contact by burying a conductive material in the contact hole.

The present invention provides a semiconductor device, comprising an isolation insulating layer to define an active region on a semiconductor substrate, one or more gate electrodes formed on the active region and the isolation insulating layer, a spacer layer formed at sidewalls of the gate electrodes, and a contact formed between the gate electrodes, wherein the contact is formed on an inner surface of a trench in the isolation insulating layer, and the inner surface is covered with the spacer layer over.

DESCRIPTION OF EMBODIMENTS

Description will now be made in detail in reference to the embodiment of the present invention and accompanying drawings. Wherever possible, the same reference numbers will be used throughout the drawings to refer to the same or like elements.

FIGS. 9 to 15 are cross-sectional views illustrating a method for manufacturing a semiconductor device according to an embodiment of the present invention.

Figure 1:
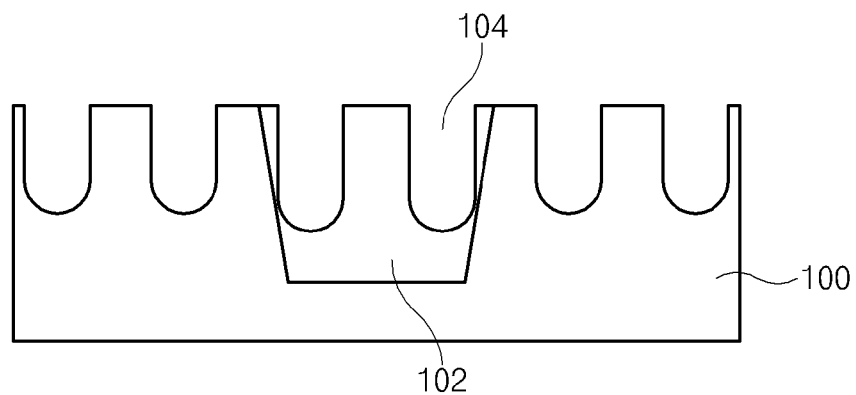
FIGS. 1 to 7 are cross-sectional views illustrating a method for manufacturing a general semiconductor device.
Figure 2:
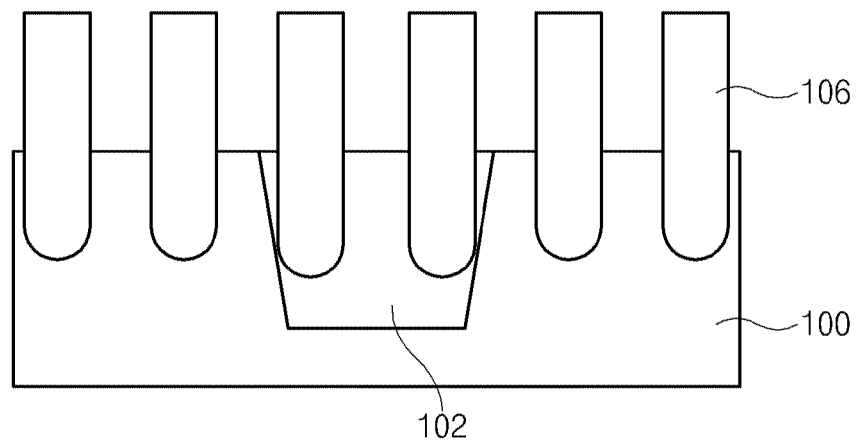
Figure 3:
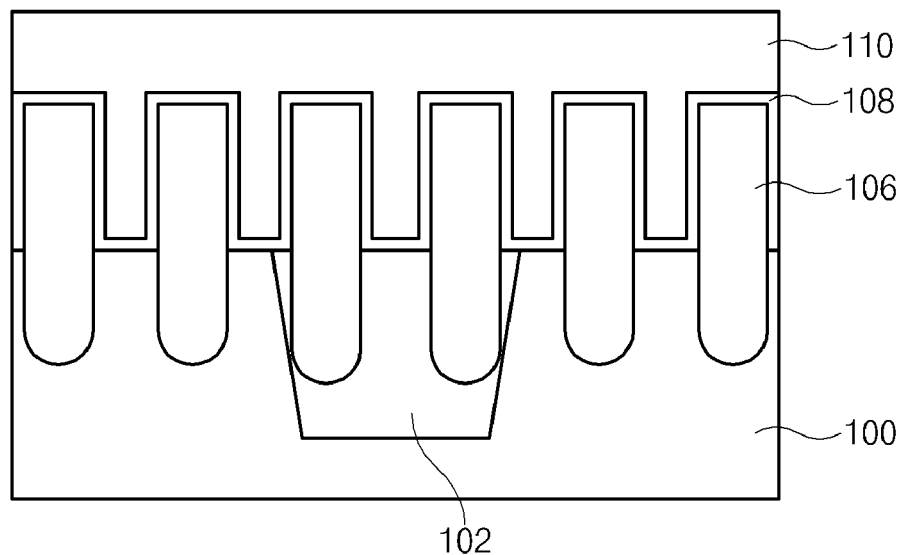
Figure 4:
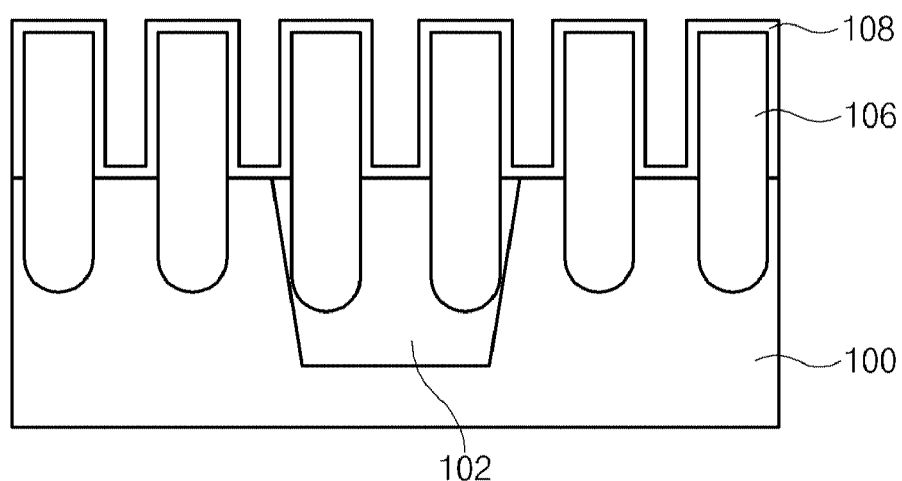
Figure 5:
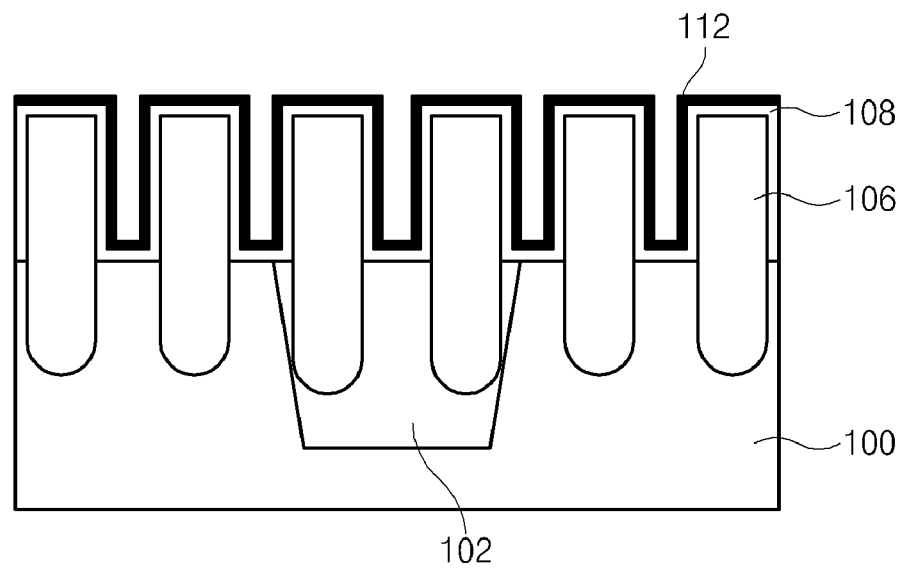
Figure 6:
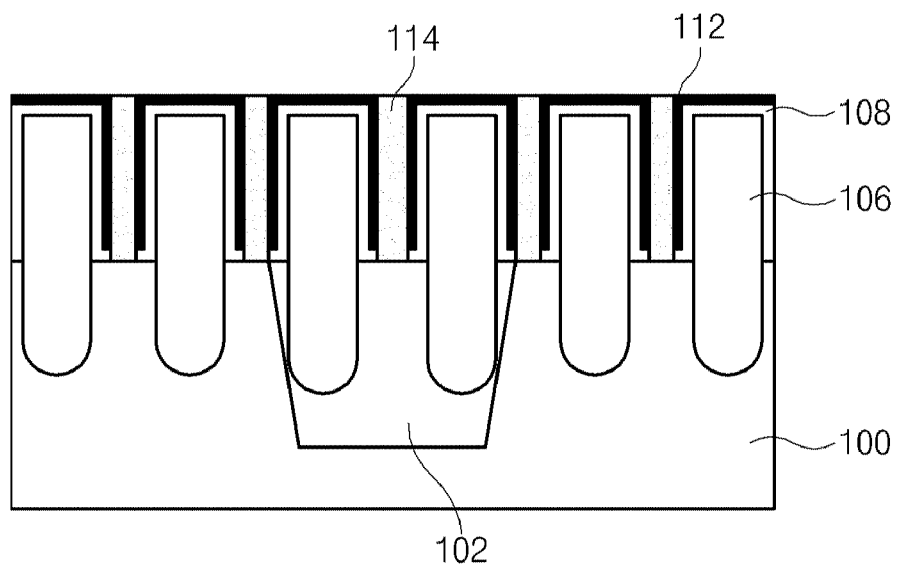
Figure 7:
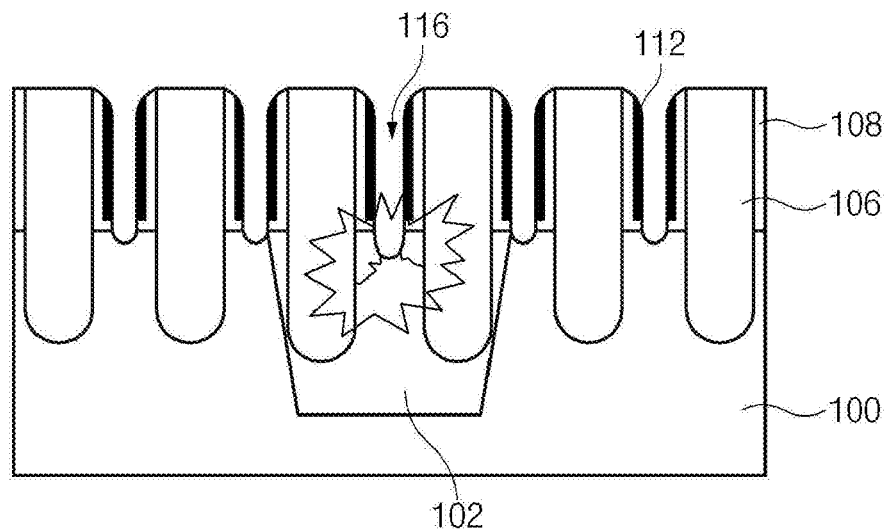
Figure 8:
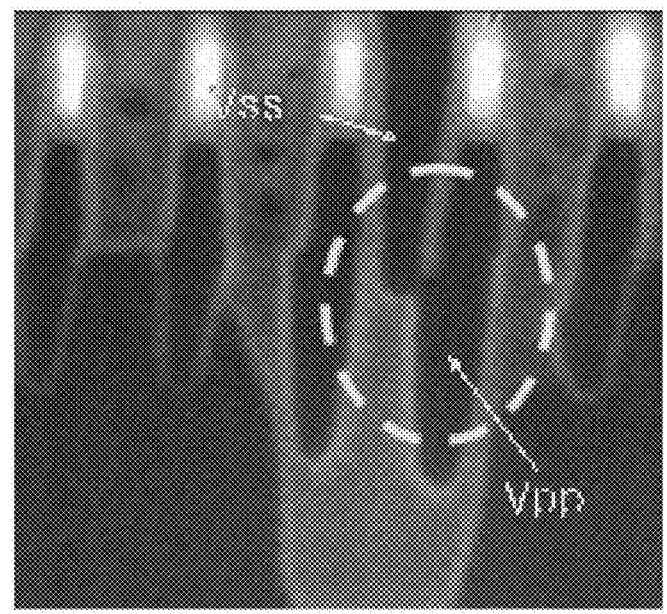
FIG. 8 is a scanning electron microscope (SEM) image illustrating shortcomings of the semiconductor device manufactured by processes shown in FIGS. 1 to 7.
Figure 9:
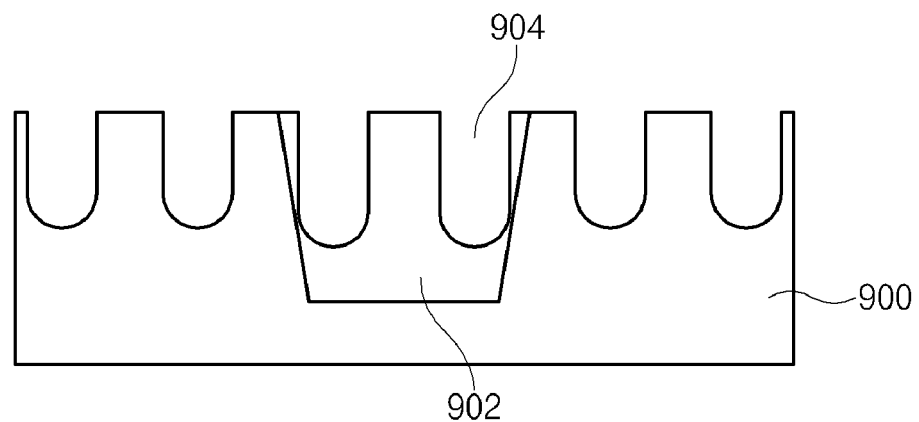
FIGS. 9 to 15 are cross-sectional views illustrating a method for manufacturing a semiconductor device according to an embodiment of the present invention.

Referring to FIG. 9, a recess 904 for forming a recess gate or a fin gate are formed on a semiconductor substrate 900 where an isolation insulating layer 902 for defining an active region is formed. The recess 904 for forming the recess gate or the fin gate is formed in both the active region and the isolation insulating layer 902.

Figure 10:
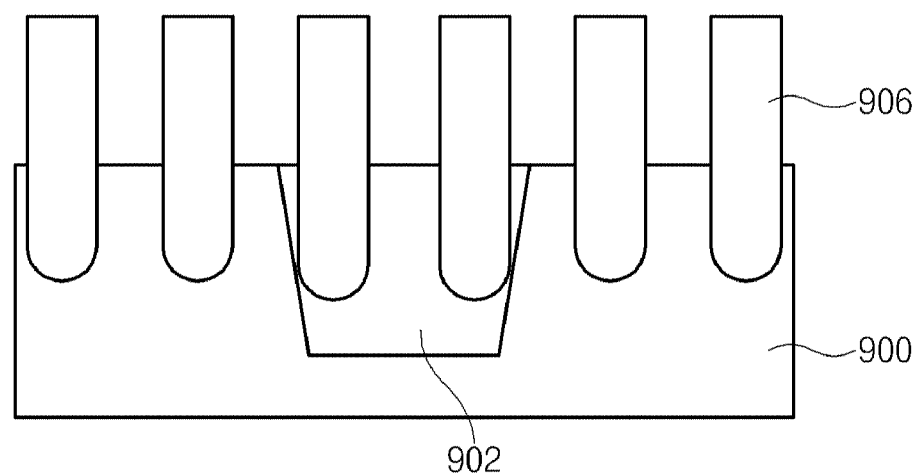

Thereafter, as shown in FIG. 10, a gate material is provided in the recess 904 so that a gate electrode 906 is formed.

Figure 11:
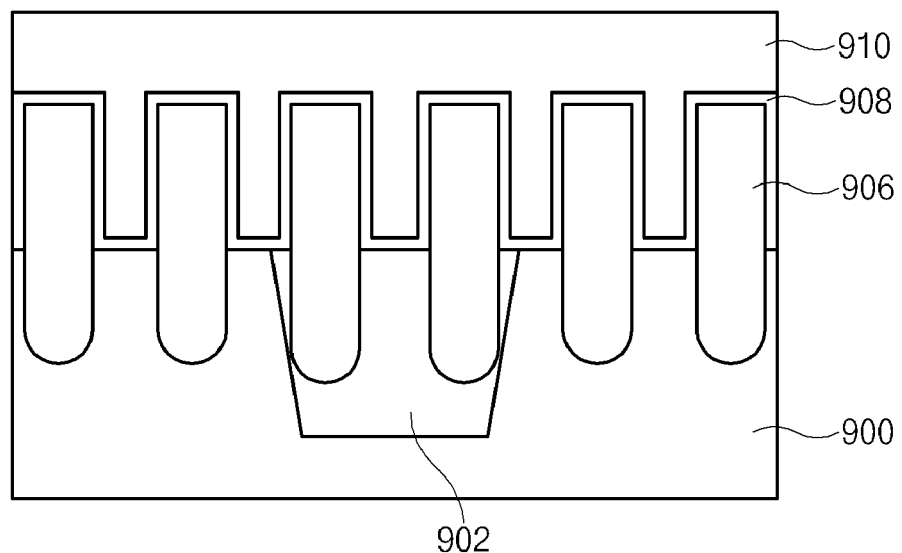

Referring to FIG. 11, a first spacer layer 908, e.g., a nitride layer, is deposited on the substrate and the gate electrode 906. In this case, the first spacer layer 908 is deposited with a predetermined thickness on the gate electrode 906 and its sidewalls. Then, an oxide layer 910 is deposited on the first spacer layer 908, so that a core region and peripheral regions on the semiconductor substrate 900 are covered with the oxide layer 910. In order to expose the core region and the cell array region, after a photoresist layer (not shown) is deposited on the oxide layer 910, the photoresist layers formed on the core region and the cell array region are etched using a cell open mask, so that the oxide layer 910 is exposed. Thereafter, the oxide layers 910 covering the core region and the cell array region are removed by a wet etching process so that the first spacer layers 908 are exposed.

Figure 12:
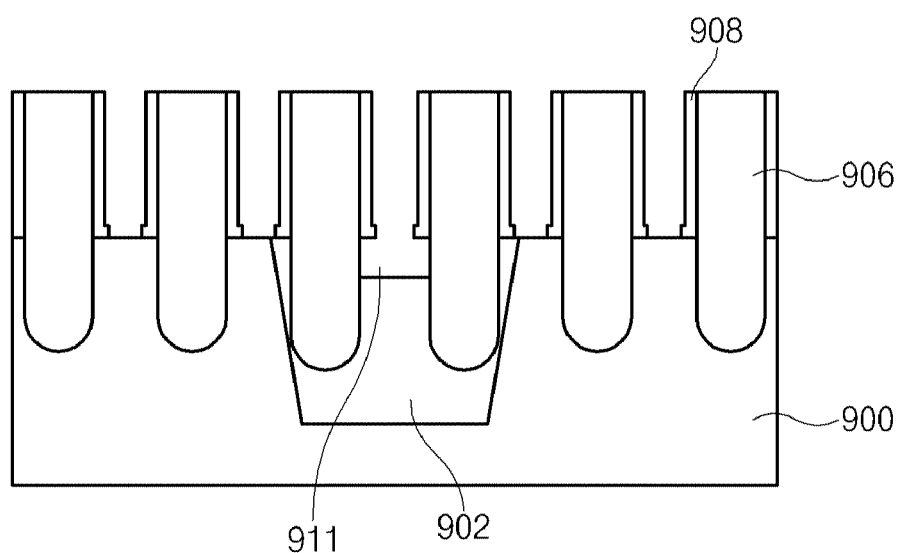

Referring to FIG. 12, a first spacer layer 908 remains at sidewalls of the gate electrode 906 even after an etch-back process, whereas the first spacer layer 908 on the top surface of the gate electrode 906, the semiconductor substrate 900, and an isolation insulating layer 902 are removed. Although FIG. 12 shows only the core region and the cell array region in which the oxide layer is completely removed, peripheral regions (not shown) are still covered with the oxide layer. Referring to FIG. 12, some parts of the first spacer layer 908 are not completely etched so that the first spacer layer 908 is apt to be partially left on the semiconductor substrate 900 and the isolation insulating layer 902. Then, the isolation insulating layer 902 exposed between the first spacer layers 908 is additionally etched to a depth of 500 Å or less using a hydrofluoric (HF) wet etching process, so that a trench 911 is formed in the isolation insulating layer 902.

Figure 13:
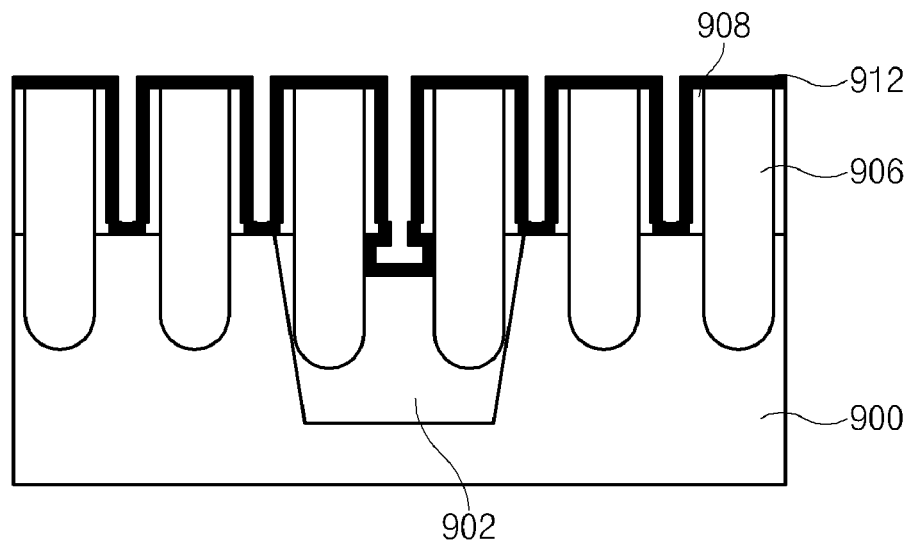

Thereafter, referring to FIG. 13, a second spacer layer 912, e.g., a nitride layer, is deposited on the exposed gate electrode 906, the first spacer layer 908, and the trench 911 in the core region. In this case, a Low Pressure Chemical Vapor Deposition (LPCVD) nitride layer with a superior step coverage property may be used as the second spacer layer 912. In the etch-back process for removing the first spacer layer 908, if the first spacer layer 908 formed on the semiconductor substrate 900 and the isolation insulating layer 902 is not completely removed, another first spacer layer 908 formed at sidewalls of the gate electrode 906 formed on the isolation insulating layer 902 and the second spacer layer 912 are partially protruded, and an upper part of the trench 911 is partially covered with the second spacer layer 912.

In this case, when a contact (such as a bit line contact or a storage node contact) formed between gate electrodes 906 is formed in a post-process, the second spacer layer 912 is formed to insulate and isolate the gate electrode 906 from either the bit line contact or the storage node contact, and is formed even in the trench 911 formed on the isolation insulating layer 902, so that excessive etching of the isolation insulating layer 902 may be prevented. In order to completely isolate the contact from the gate electrode 906, a second spacer layer 912 may be generally formed with a thickness of 50~150 Å.

Figure 14:
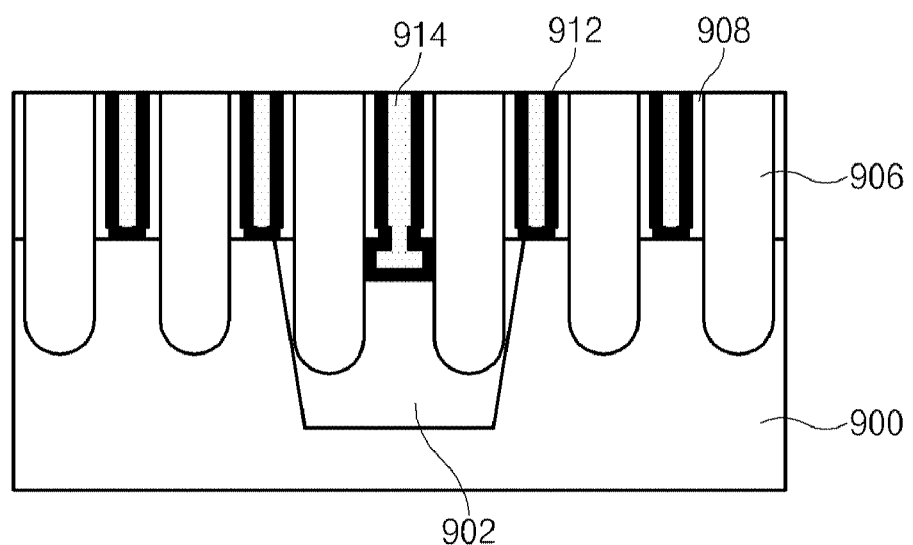

Referring to FIG. 14, an insulation material having gap-fill characteristics is deposited on the second spacer layer 912, and is then planarized by a chemical mechanical polishing (CMP) process or the like until the second spacer layer 912 is exposed. As a result, an interlayer insulating layer 914 may be formed not only in a fine space between gate electrodes but also in the trench 911 formed on the isolation insulating layer 902.

Figure 15:
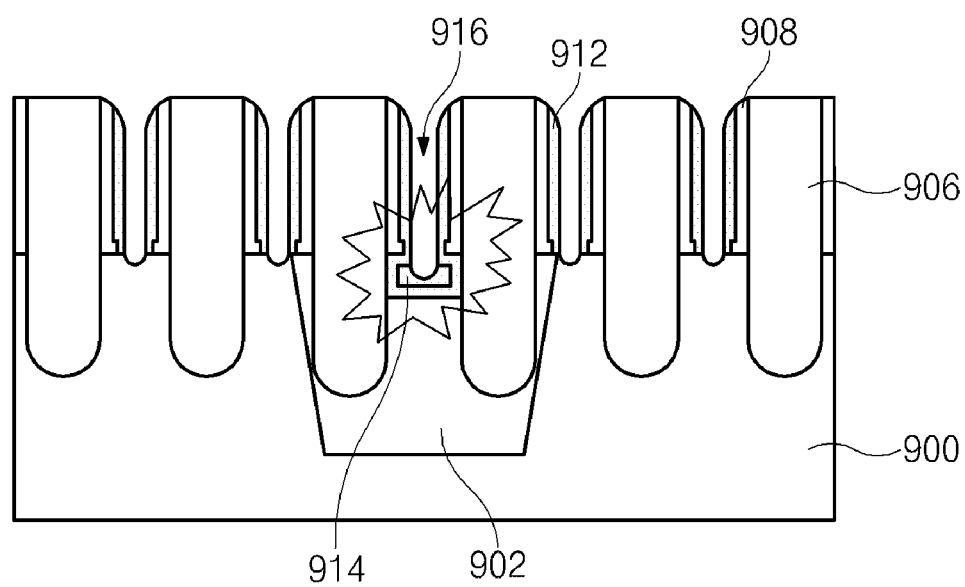

Referring to FIG. 15, an interlayer insulating layer 914 which is formed in a region where a bit line contact or storage node contact contained in the core region is removed by an etch-back process so that a contact hole 916 is formed. In this case, the contact hole 916 may be used to form a contact for connecting a capacitor or bit line which is subsequently formed to an active region. Through the above-mentioned etch-back process, first and second spacer layers 908 and 912 formed at sidewalls of the gate electrode 906 remain unetched, but the second spacer layer 912 formed on the active region is completely removed. In this case, one second spacer layer 912 formed on the active region is completely removed by controlling the etching depth of the etch-back process, but another second spacer layer 912 formed in the trench 911 disposed at a position, which is lower than that of the one second spacer layer 912 by a depth of 500 Å, is not removed. Accordingly, a conductive material is buried in the contact hole 916, so that the gate electrode 906 and the conductive material are not electrically short-circuited with each other by the second spacer layer 912.

The second spacer layer 912 is formed on the inner surface of the trench 911 formed on the exposed isolation insulating layer 902, so that it prevents the isolation insulating layer 902 from being excessively etched in an etching process for forming the contact hole 916 through a self-aligning etching process. Consequently, the present invention prevents the gate electrode 906 from being exposed when the contact hole 916 is formed, thereby preventing the occurrence of poor self-aligned contact (SAC). In addition, a process margin increases in a fabrication process of the semiconductor device, and the reliability of elements contained in the semiconductor device also increases.

As described above, a method for manufacturing a semiconductor device according to an embodiment of the present invention includes forming a first spacer layer at sidewalls of gate electrodes, forming a trench by etching an isolation insulating layer exposed between the gate electrodes, forming a second spacer layer at sidewalls of the gate electrodes and the trench, and forming an interlayer insulating layer between the gate electrodes.

Particularly, the semiconductor device according to the present invention exposes a core region using a cell open mask, removes the first spacer layer 908 using an etch-back process, and etches some parts of the exposed isolation insulating layer 902 to a depth of 500 Å using a wet etching process, thereby forming the trench 911. In this case, the isolation insulating layer 902 may be formed of an insulation material used for the SOD deposition process, or may be an SATEOS layer. The present invention is applicable even when the isolation insulating layer 902 is configured in the form of a single-layer structure or a double-layer structure. Thereafter, the second spacer layer 912 having superior gap-fill properties may be formed in the trench 911 formed on the isolation insulating layer 902, and the trench 911 may be covered with parts protruded from sidewalls of the gate electrode 902. In this case, the semiconductor device of the present invention may acquire the same effect as in a double-layered second spacer layer 912 formed on the isolation insulating layer 902 such that it may prevent the isolation insulating layer 902 from being etched in the etch-back process for forming the contact hole 916.

As apparent from the above description, in a process for forming contacts after forming recess gates, the semiconductor device of the present invention prevents the isolation insulating layer formed in the inactive region from being excessively etched by a post-process such as cleaning or the like, such that the recess gate and the contact are not electrically short-circuited. In addition, the semiconductor device of the present invention easily prevents the occurrence of the short-circuiting between the recess gate formed in the inactive region and the contact. Therefore, the semiconductor device of the present invention need not simultaneously apply two or more materials (for example, an insulation material used for the SOD deposition process and an SATEOS layer) to an insulation layer of the inactive region, so that it prevents process steps from being complicated and also prevents a Turn Around Time (TAT) from being deteriorated.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, comprising:

providing a substrate including an active region and a field isolation region adjacent to the active region;

forming a first recess gate electrode in the active region and a second recess gate electrode in the field isolation region;

forming a first spacer over sidewalls of the first recess gate electrode and the second recess gate electrode;

etching the field isolation region to form a trench at side of the second recess gate electrode; and forming a second spacer over the first spacer and inside the trench.

2. The method according to claim 1, wherein the trench exposes a lower sidewall of the second recess gate electrode, and the second spacer covers the exposed lower sidewall of the second recess gate electrode.

3. The method according to claim 2, wherein the first spacer has a protruding bottom end extending from the sidewall of the second gate electrode.

4. The method according to claim 1, wherein the trench is formed to a depth of about 300 Å to about 1000 Å using a hydro-fluoric (HF) wet etching process.

5. The method according to claim 1, wherein the first spacer and the second spacer each includes nitride.

6. The method according to claim 1, wherein the forming of the first spacer layer includes:

depositing a first spacer layer over the active region including the first gate electrode and the field isolation region including the second gate electrode; and etching the first spacer layer by performing an etch-back process to form the first spacer at the sidewalls of the first and the second recess gate electrodes while exposing the field isolation region.

7. The method according to claim 1, further comprising:

filling the trench covered with the second spacer with insulating material; and selectively removing the insulating material to form a first contact hole exposing the surface of the active region and a second contact hole in the field isolation region.

8. The method according to claim 1, wherein the second spacer has a protruding bottom end extending laterally.

9. The method according to claim 1, wherein the second spacer is formed using a Low Pressure Chemical Vapor Deposition (LPCVD) using a material with superior step coverage to the first spacer.

10. The method according to claim 1, wherein the first and second spacers are formed using an etch-back process, respectively.

11. The method according to claim 1, the trench is formed using a wet etch process.

* * * * *